(12) United States Patent
Krinker

(10) Patent No.: US 6,198,290 B1
(45) Date of Patent: Mar. 6, 2001

(54) METHOD TO DETECT DEFECTIVE CAPACITORS IN CIRCUIT AND METERS FOR THAT

(76) Inventor: Mark Krinker, 5501 Fav, Brooklyn, NY (US) 11220

(*) Notice: Subject to any disclaimer, the term of this patent is extended or adjusted under 35 U.S.C. 154(b) by 0 days.

(21) Appl. No.: 08/897,255

(22) Filed: Jul. 18, 1997

(51) Int. Cl.$^7$ .................................................. G01R 31/12
(52) U.S. Cl. .................................. 324/548; 324/679
(58) Field of Search .................................. 324/548, 133, 324/301, 452, 457, 500, 519, 524, 678, 679

(56) References Cited

U.S. PATENT DOCUMENTS

| | | | |
|---|---|---|---|
| 3,801,900 | 4/1974 | Szasz | 324/61 R |
| 4,184,112 | * 1/1980 | Cox | 324/658 |
| 4,216,424 | 8/1980 | Vette | 324/62 |
| 4,426,616 | * 1/1984 | Maier | 324/658 |
| 4,745,359 | * 5/1988 | Leitz | 324/133 |
| 4,931,721 | * 6/1990 | Berrigan et al. | 324/658 |
| 4,968,947 | 11/1990 | Thorn | 324/701 |
| 5,159,526 | 10/1992 | Marek | 361/301 |
| 5,502,375 | 3/1996 | Marek | 324/133 |
| 5,504,422 | * 4/1996 | Bandschuh et al. | 324/658 |
| 5,726,579 | * 3/1998 | Masuda | 324/658 |

OTHER PUBLICATIONS

Electronics Now Sep. 1997 Capacitor Wizard p. 68.

* cited by examiner

Primary Examiner—Safet Metjahic
Assistant Examiner—T. R. Sundaram
(74) Attorney, Agent, or Firm—I. Zborovsky

(57) ABSTRACT

A method for detecting defective capacitors in a circuit and meters for that, based on passing alternative measuring current through capacitor to be tested. According to the first versions of the disclosed method, measuring signal is being applied between an envelop of the capacitor and one of its terminals to inject the measuring current inside the capacitor. That causes the current to flow through a dielectric between capacitor's plates and affect the current consumption depending on quality of the capacitor. An indicator of the meter displays one of voltage-current relationships that characterizes the capacitor. In this version the measuring current flows through a closed circuit. Another version is based on applying measuring signal to an envelop of the capacitor that inject the measuring current sequentially flowing from the meter, measuring electrode, the envelope, the capacitor's plate, the dielectric between plates, the capacitor's terminal, to a total metallic surface of all the capacitor's environment. This version uses one electrode and an open circuit. The meter displays changes in a resonance measuring signal that is a measure of the quality of the capacitor.

6 Claims, 4 Drawing Sheets

METHOD TO DETECT DEFECTIVE CAPACITORS IN CIRCUIT AND METERS FOR THAT

BACKGROUND

1. Field of Invention

This invention relates to diagnostic electronic equipment, specially to finding out defective capacitors in a circuit.

2. Description of Prior Art

Detecting defective parts right in a circuit reduces consumption of time and cancel necessity of repeating harmful soldering. The major problem of this diagnostic technology is to eliminate an influence of surrounding circuitry which distorts reading of measuring apparatus.

Inventors created several types of diagnostic techniques and apparatus that have much in common. U.S. Pat. No. 4,216,424 to Vette et al. (1980) discloses Method and apparatus for testing electrolytic capacitors in-circuit based on employing a low voltage AC ohmmeter to measure Equivalent Series Resistance (ESR) at relatively high frequency 100 KHz that makes a capacitive reactance Xc of the test capacitor negligible so measuring current mostly flows through the capacitor is being tested. Portion of measuring apparatus serves to protect the meter from damaging by remaining DC charge.

U.S. Pat. No. 5,159,526 (1992) to Marek et al. shows Method and apparatus for determining orientation of polarized capacitors in-circuit by means of applying signals to inner and outer conductive plates of capacitor with a further analyzing of external electric field generated by the outer plate. Although being in-circuit, this method covers only limited characteristic (orientation) and requires extended (3) number of terminals being connected to the capacitor that makes it inconvenient. U.S. Pat. No. 5,502,375 (1996) also to Marek et al. discloses modification of this method reducing to two repeated measurements reverceing the voltage and reference signals. The ratio of magnitudes of electric field in both position of measuring electrodes determines the orientation. This method requires an additional time and still does not measure quality-related characteristics of capacitors.

The group of methods for a non-destructive measurement of conductive and non-conductive thin layers can be also related to in-circuit capacitive methods in terms of physical processes. U.S. Pat. No. 4,968,947 (1990) to Thorn et al. and U.S. Pat. No. 3,801,900 (1974) to Szasz show measuring systems for such layers based on evaluating a displacement current through measuring arrangement with layers to be measured. These methods and apparatus can not be used for discrete elements with capacitive characteristics.

All recited methods and apparatuses suffer from a number of disadvantages:

(a) The necessity to connect at least 2 measuring electrodes to leads of capacitor is being tested. In real electronic boards capacitors' terminals have a limited access and coated with isolating layer with a purpose of security. It makes diagnostic process inconvenient and time-consuming.

(b) The quality of conventional in-circuit testing depends on probing frequency. The more frequency, the less an influence of surrounding parts because a high-frequency current mostly flows through capacitor is being tested rather than through surrounding circuitry with non-capacitive characteristics. This excludes possibility to measure at low frequencies when necessary and limits the scope of in-circuit methods.

(c) The known methods suffer from impossibility to evaluate in-circuit one of two connected in-parallel capacitors. Measuring current simply flows through both of them, that drastically reduces the resolution of in-circuit methods.

(d) The use of ESR only also limits an informational value of in-circuit methods because ESR by itself does not define quality of capacitor uniquely. Quality of capacitor is defined by its dielectric loss related to its tangent of dielectric loss angle $tg\delta = \omega \cdot C \cdot ESR$, where $\omega$ is an angular frequency and C is capacitance. Quality factor of capacitor $Q = 1/tg\delta$, so two capacitors with equal ESRs can have distinct qualities, depending on capacitance.

(e) The conventional apparatus suffer from complexity because of special measures to reduce the influence of electric environment: parallel circuitry, non-linear two-terminal remaining charges and so on.

OBJECTS AND ADVANTAGES

Accordingly, several objects and advantages of my invention are:

(a) to provide measuring with one measuring electrode connected with no necessity to connect it to capacitors' leads or terminals;

(b) to provide measuring in a wide range of frequencies, depending on necessity and therefore increase in-circuit methods' informational value;

(c) to provide possibility evaluate one of two connected in-parallel capacitors without influence from another;

(d) to provide increasing informational value of the method by measuring quality factor Q and tangent of dielectric loss angle $tg\delta$ of capacitor in-circuit;

(e) to provide more reliability of measuring apparatus by means of reducing number of parts.

Further objects and advantages of my invention will become apparent from a consideration of the drawing and ensuing description.

Figure 1:
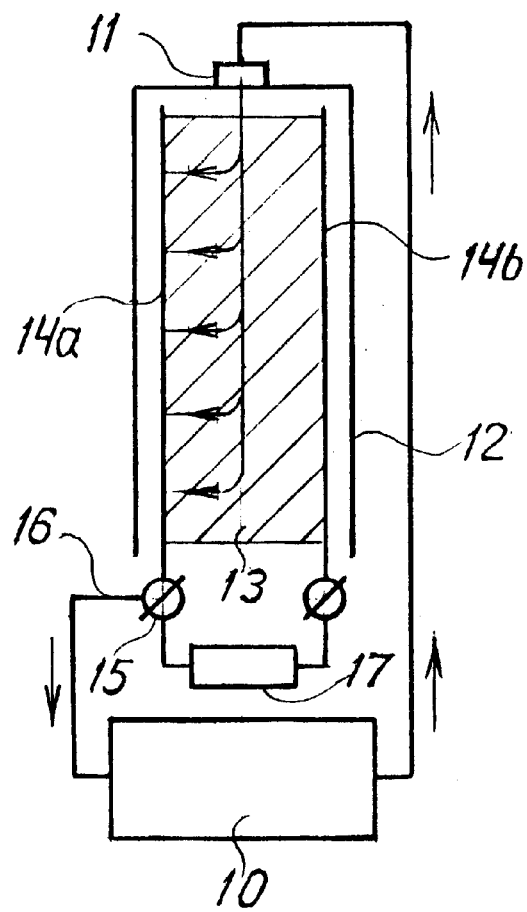
FIG. 1 is a schematic circuit diagram of measuring by the first version of this method with a closed circuit with two measuring electrodes.

The table shows logarithm of tangent of dielectric loss angle (tgδ) versus logarithm of angular frequency (ω) for capacitor is being tested when measuring by both conventional method and the new one under different value of internal resistor.

REFERENCE MATERIALS IN DRAWING

| 10 | meter | 11 | measuring electrode |
|---|---|---|---|
| 12 | capacitor's envelope | 13 | interplate media |
| 14a, 14b | plates | 15 | terminal |
| 16 | second measuring electrode | 17 | external circuit |
| 20 | meter | 21 | measuring electrode |
| 22 | envelope | 23a, 23b | plates |
| 24 | inteplate media | 25 | terminal |
| 26 | resistor | 27 | conductive surface |
| 28 | circuit, connected in parallel | | |
| 30 | probing current source | 31 | measuring electrode |
| 32 | measuring electrode | 33 | sensor-resistor |
| 34 | comparator | 35 | comparator |
| 36 | indicator | 37 | diode |
| 40 | timer | 41 | ramp-voltage generator |
| 42 | reactance-element | 43 | measuring resonant circuit |
| 44 | amplitude detector | 45 | maximum-of-signal finder |
| 46 | trigger | 47 | DC-filter |
| 48 | differential amplifier | 49 | reference voltage source |
| 50 | square-unit | 51 | arithmetic unit |
| 52 | display | 53 | peak-detector |
| 54 | differential amplifier | 55 | reference voltage source |
| 56 | measuring electrode | 57 | capacitor is being tested |

DESCRIPTION OF THE METHOD

The proposed method to test capacitors in a circuit is based on replacement conventional way of flowing alternating measuring current through the circuit "meter—capacitor's terminals—plate—dielectric—another plate—terminal—meter" for a new approach: "meter—capacitor's terminal—plate—dielectric—capacitor's envelop—meter's electrode—meter". That allows to avoid influence of any circuit connected to capacitor in parallel and makes direct measurement in a circuit possible.

Another version of the method does not use closed circuit of passing of measuring current. Instead of that, measuring current passes the following way: "meter—measuring electrode—capacitor's envelope—dielectric—plate—capacitor's terminal—total electric capacitance of all the parts, the capacitor's terminal is associated with". This way employs just one measuring electrode. The nature of formation of measuring probing current is a displacement current caused by polarization of interplate media and all the parts, connected to capacitor's terminal, as well.

The passing measuring current in both versions are achieved by means of injecting such a current through the envelope of the capacitor to be tested. For this purpose, measuring signal is being applied to envelope of the capacitor.

In this method, dielectric properties of interplate media are taken as a criteria of quality of capacitor is being tested. Any deterioration of this media results in origination of dielectric energy loss. The meter provides measuring dielectric loss or any related to that characteristics: tangent of dielectric loss angle, dissipation factor, power factor, phase shift between voltage and current through capacitor and so on.

Description and Operation of the Method—FIGS. 1–4

The first version of the Method is shown in FIG. 1, with a closed measuring circuit employs a meter 10 associated with a measuring electrode 11 that is applied to a capacitor's envelope 12. An interplate media 13 is located between plates 14a and 14b, one of them is associated with a terminal 15, which is coupled to a second measuring electrode 16. An external circuit 17 is connected in parallel. The arrows show direction of the measuring current.

As seen from FIG. 1, measuring current of the meter 10 does not flow through the external circuit 17 connected in parallel to the capacitor is being tested, that allows to estimate the capacitor directly in a circuit.

Figure 2:
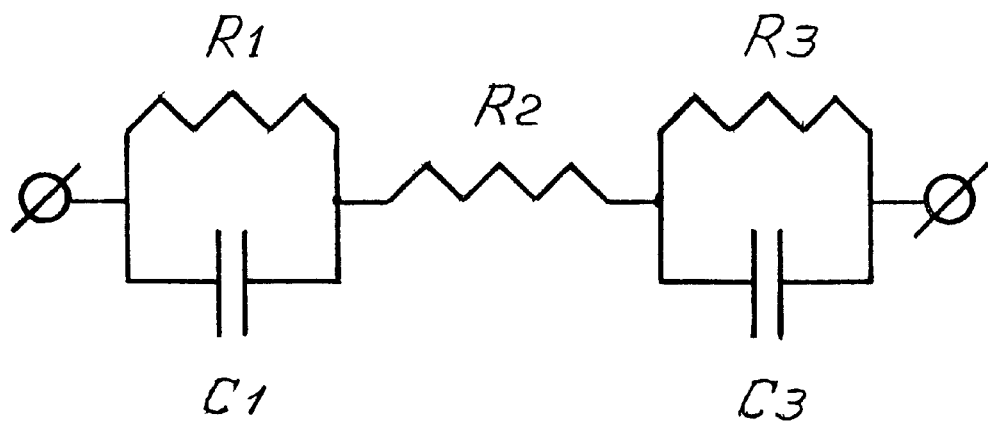
FIG. 2 is an electric equivalent of this version of the Method with the closed measuring circuit.

For electrolytic capacitors with a metallic envelope, the electric equivalent can be represented by a sequence of CR-circuits connected, one to another, in series, as it is shown in FIG. 2. In the figure, C1R1 shows electric properties of an area formed by metallic envelope with thin oxide film on it (C1) with its residual resistance (R1) and a tissue (R2), while C3R3 represents dielectric properties of thin oxide film on a surface of the plate in electrolytic capacitors. Elements R2 and C3R3 represent the interplate media 13 in FIG. 1. With equal definitions, C and R-elements can be connected in series which complies with the Equivalent Series Resistance (ESR) parameter of capacitors. In this case ESR represents all the energy loss caused by imperfectivity of the capacitor is being tested, and the simplified electric equivalent looks like ESR connected in series with effective capacitance.

Figure 3:
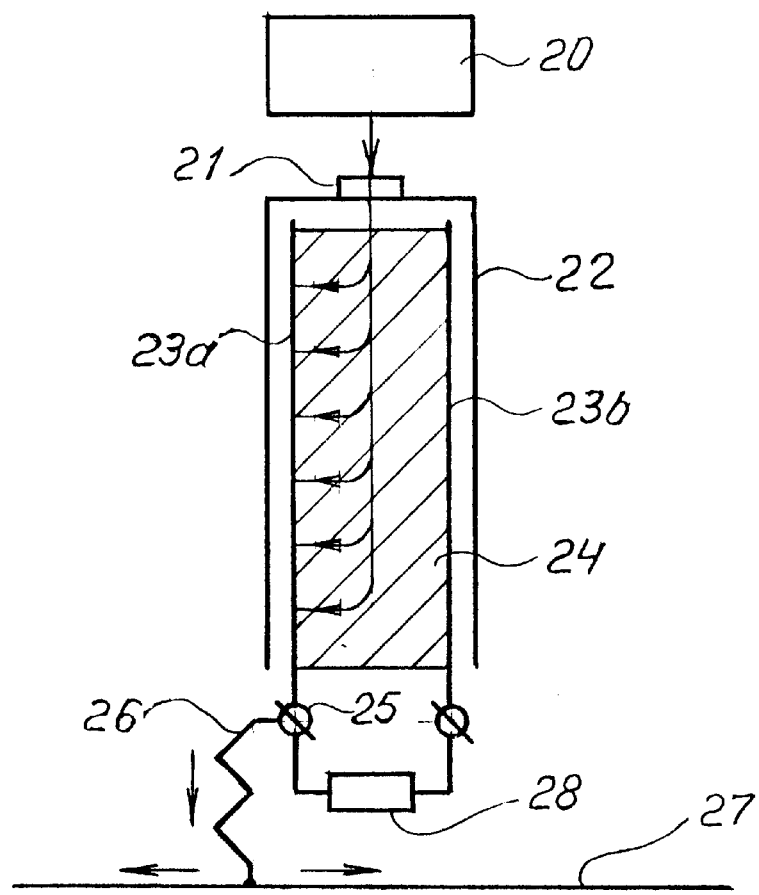
FIG. 3 is a schematic circuit diagram of measuring by another version of this Method with an open circuit and one measuring electrode.
Figure 4:
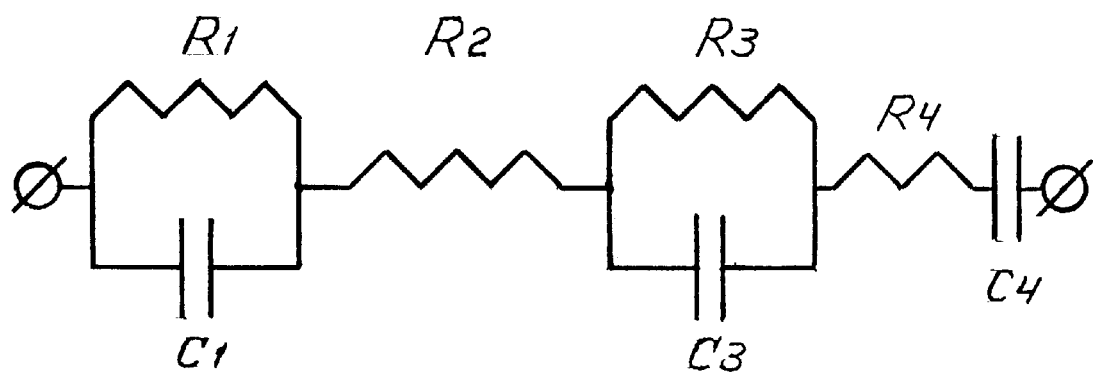
FIG. 4 is an electric equivalent of another version of the Method with the open circuit and one measuring electrode.

Another version of this method, with an open measuring circuit, is based on using electric capacitance of all the circuit associated with capacitor is being tested to form measuring current. In this case measuring current is a displacement one by its nature and is caused by electric polarization of a surface of conductors the tested capacitor is connected to. FIG. 3 shows how the second version works. The circuit consists of a meter 20, associated with a measuring electrode 21 that is applied to a metal envelope 22 which contains plates 23a and 23b and an interplate media 24. The plate 23a is associated with a terminal 25 which is coupled to a resistor 26 which is connected to a surface 27 by its opposite terminal. An element 28 represents a circuit connected in parallel to capacitor is being tested. FIG. 4 shows such a circuit's electric equivalent. The elements C1R1, R2, C3R3 perform same functions they did in the first version in FIG. 2. The surface causing displacement current is shown as an additional capacitor C4 while coupling elements between tested capacitor and this surface are represented by a resistor R4. Arrows show the direction of testing current. As seen from FIG. 3. measuring current of the meter 20 by-passes the external circuit 28 so it can't affect the measurement. Measuring current is caused by polarization of the surface 27 and is defined by a total impedance of the circuit. As that takes place, just one measuring electrode can be used, because the measuring current is provided by polarization process rather than a conductivity. Like in the case of first version of the Method, all the energy loss can be shown concentrated in ESR which is connected in series to effective capacitance.

For both versions of the method the following expression for the impedance Z can be obtained:

$$Z = \frac{R1}{1+(\omega C_1 R_1)^2} + R2 + \frac{R3}{1+(\omega C_3 R_3)^2} + R4 - j\left(\omega C_1 R_1^2 + \omega C_3 R_3^2 + \frac{1}{\omega C_4}\right)$$

Hence it follows:

$$tg\delta = \left(\frac{R1}{1+(\omega C_1 R_1)^2} + R2 + \frac{R3}{1+(\omega C_3 R_3)^2} + R4\right) \cdot \left(\omega C_1 R_1^2 + \omega C_3 R_3^2 + \frac{1}{\omega C_4}\right)^{-1}$$

ESR=tg$\delta$/$\omega$Cres, where Cres is the resulting capacitance of the circuit is being tested.

For evaluation of the Method, electrolytic capacitor with C1=1 $\mu$F and R1=1 MOhm was considered. Resistor R2 is considered for two values 10 and 1000 Ohms that corresponds to good and poor quality capacitor respectively. In all the cases C3=1 $\mu$F, while R3=1 MOhm, R4=10 Ohm and C4=100 pF are taken from an experiment. All the results for tg$\delta$ are gathered in the Table. (The Table is printed on page 6).

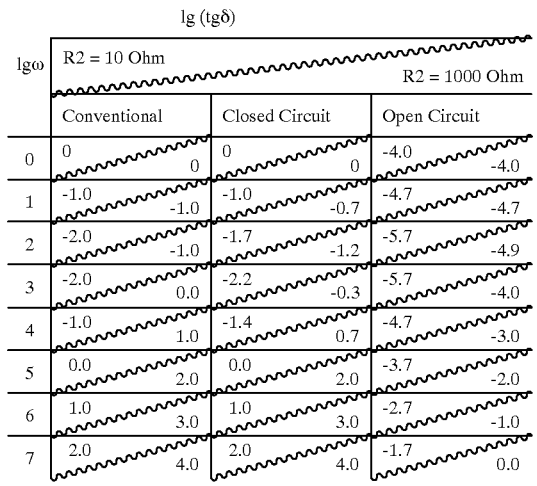

Comparison the difference of logarithms for different values of R2 in the Table reveals that all the qualitative characteristics of relations between good and poor quality capacitors remain valid regardless on the method they were obtained by. Indeed, the difference of logarithms That confirms possibility to measure capacitors directly in a circuit by proposed Method without influence of the rest of the circuit. The difference between the versions with the closed and open measuring circuits is that the last one has low resulting capacitance (~100 pF) defined mostly by the surface the tested capacitor is associated with (C4 in the electric equivalent), that shifts range of the energy loss into high frequencies. To exclude the influence of this capacitance, measuring ESR rather than tg$\delta$ is preferable for the open circuit version. As seen from equations for Z and tg$\delta$, the influence of changes of interplate resistance R2 results in frequency band upper 1000 Hz while the influence of changes of resistance of oxide films R1 on the envelope and R3 on the plate results mostly in lower frequency than 1000 Hz.

Figure 5:
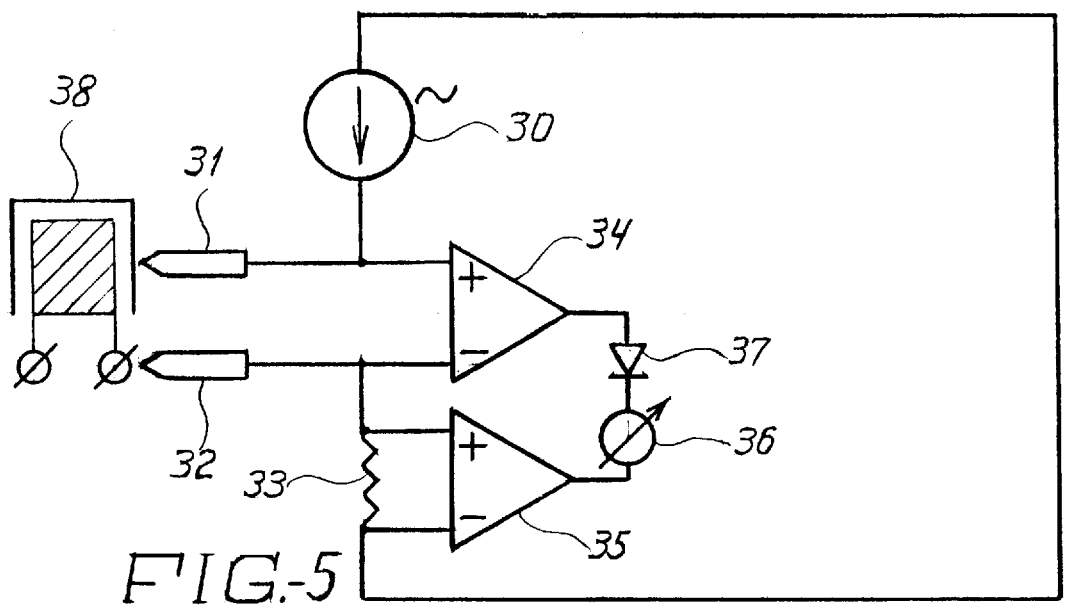
FIG. 5 is a schematic unit diagram of a tester for testing a quality of capacitor based on the first version of the Method,—with a closed measuring circuit.
Figure 6A:
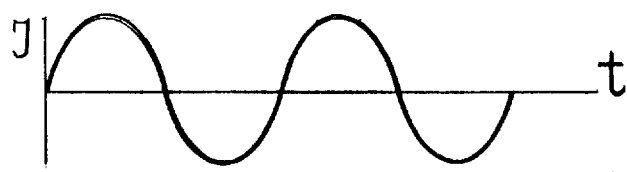
FIG. 6*a* shows wave form of current flowing through capacitor is being tested in the tester in FIG. 5.
Figure 6B:
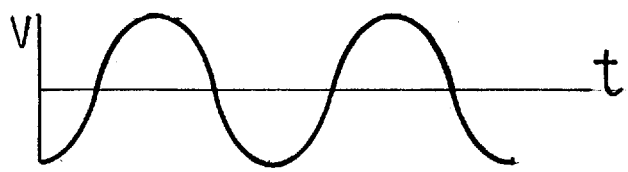
FIG. 6*b* shows wave form of a voltage drop across the capacitor is being tested in FIG. 5.
Figure 6C:
FIG. 6*c* shows wave form of pulses across comparator's 34 output in FIG. 5.
Figure 6D:
FIG. 6*d* shows wave form of pulses across comparator's 35 output in FIG. 5.
Figure 6E:
FIG. 6*e* shows pulses of current through indicator 36 in FIG. 5.
Figure 7:
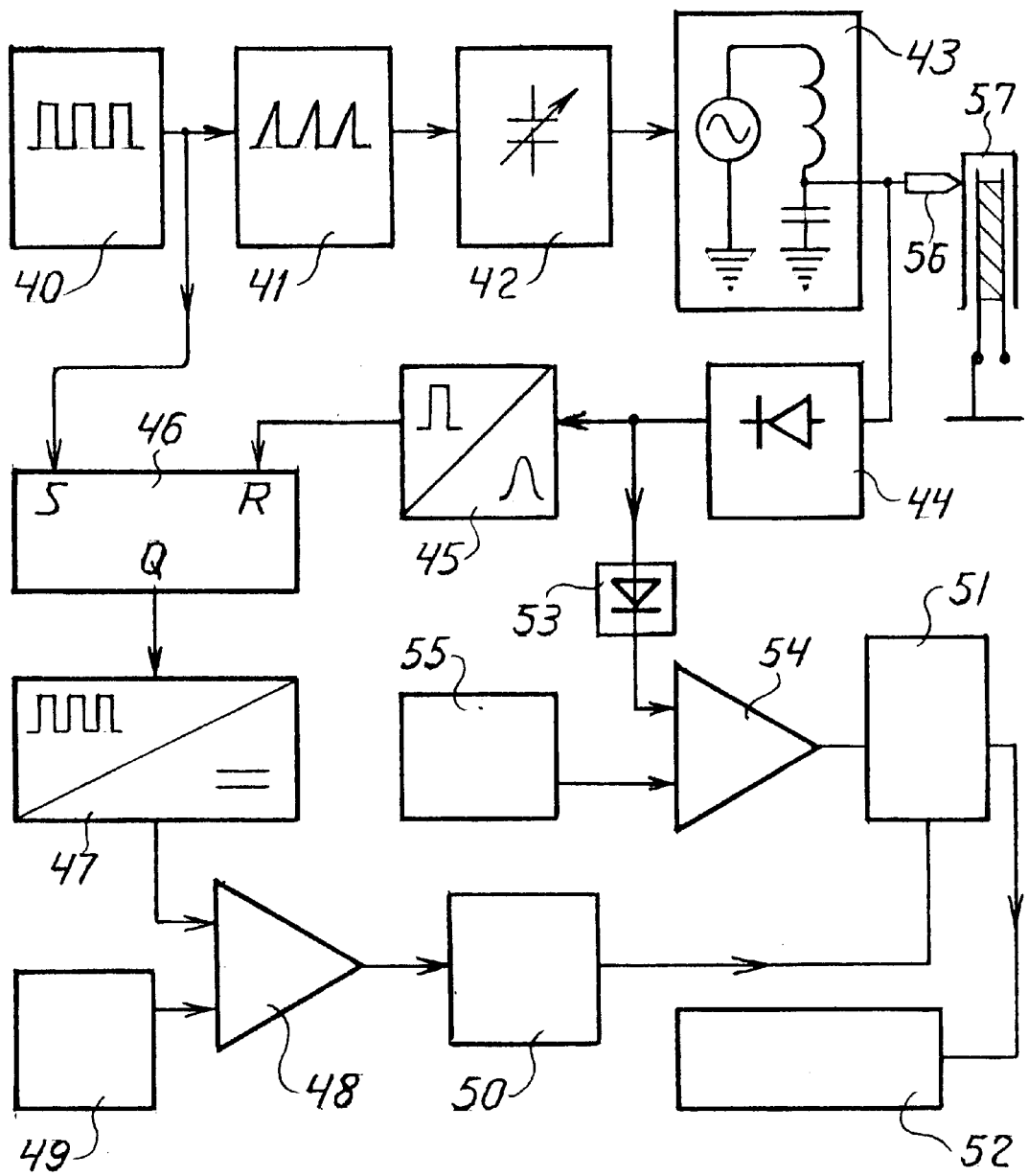
FIG. 7 is a schematic unit diagram of tester to measure on a base of another version of the Method,—with an open measuring circuit.

Description of the Preferred Embodiments—FIGS. 5–7

The embodiment of the present invention shown in FIG. 5 serves the first (closed-circuit) version of the Method and comprises a probing current source 30, coupled to measuring electrodes 31 and 32, a measuring sensor-resistor 33, connected in series with a circuit of flowing measuring current of source 30, two identical comparators 34 and 35 with their inputs coupled in series to each other and connected by an input of comparator 34 to electrodes 31–32 and, by input of comparator 35, to resistor 33. Output of said comparators are connected to an indicator 36 through a diode 37. A capacitor 38 is being is connected to electrodes 31–32. One of the electrodes 31 and 32 serves as a marker at the same time and has a conducting tip. That allows to mark defective part simultaneously with a measuring, in convenient way.

The apparatus shown in FIG. 7 is intended for another version of the Method, with the open circuit. This version uses ESR rather than tg$\delta$ as a criterion of capacitor's quality. This means taking into consideration capacitance of all surfaces the capacitor is being testes is associated with. The meter in FIG. 7 operates on a base of the method of variation of reactance (method of Q-meter). This method meets all the technical requirements of the version with open circuit. The method of Q-meter is based on repeated measurements quality of resonant circuit (Q) without capacitor is being tested and with it. To bring the testing circuit to resonance conditions, variation of its reactance is used. If when measuring Q1 and Q2, is a quality of resonant circuit without tested capacitor and with it, respectively, and C1 and C2 is residual capacitance of the resonant circuit without capacitor and with it, and $\omega$ is a circular frequency, then

ESR=C1(Q1–Q2)/(C1–C2)Q1Q2.

The meter in FIG. 7 comprises a timer 40, connected to start-up input of a ramp-voltage generator 41, that is coupled to control input of a reactance-element 42, connected to a circuit of a measuring resonant circuit of unit 43. An amplitude detector 44 is connected, by its input, to resonant circuit of unit 43, and by its output—to a maximum-of-signal finder 45, that forms a single pulse when its input signal passes its maximum, a trigger 46, connected, by its reset-input, to output of said finder 45, and, by its set-input, to output of the timer 40. An input of a DC-filter 47 is coupled to output of trigger 46, while output of filter 47 is connected to one of inputs of a differential amplifier 48. Another input of differential amplifier 48 is connected to a reference voltage source 49. The output of said differential amplifier is connected to a square-unit 50. The output of square-unit 50 is coupled to one of inputs of an arithmetic unit 51, whose output is connected to a display 52. An input of a peak-detector 53 is coupled to output of amplitude detector 44, while an output of peak-detector 53 is connected to one of inputs of a differential amplifier 54, another input of said amplifier is connected to a reference voltage source 55. An output of a differential amplifier 54 is connected to another input of arithmetic unit 51. A measuring electrode 56 is connected to a resonant circuit of unit 43 and to a capacitor 57 is being tested, as well. The measuring electrode 56 has a marking tip to mark defective capacitor when testing.

Operation—FIGS. 5–7

The meter shown in FIG. 5, that serves the first version of the Method (closed-circuit version) works as that is shown in FIG. 6. When sinus probing current of the source 30 flows through the capacitor 38 is being tested, it makes a voltage drop across it. FIG. 6A–6E shows phase relations between current and voltage in such a system for good-quality capacitor. In such a case a current (FIG. 6A) leads a voltage (FIG. 6B) in phase for a quarter of a period. The comparators 34 and 35 convert drops of the sinus voltages across the electrodes 31–32 and the resistor 33 into rectangular pulses. The phase shift between these pulses (FIG. 6C–6D) reflects that for current and voltage for the capacitor 38 is being tested. The voltage across the indicator 36 is formed when out-of-phase condition of phases of output voltages of the comparators 34 and 35 takes place. Under normal phase shift of a quarter of a period, the resulting current pulse through the indicator 36 (FIG. 6E) lasts same time and its indication reaches a possible maximum. When the capacitor 38 has a poor quality, this shift is as much as less, duration of the pulse gets less and the mean voltage across indicator 36 and current through it reduces that results in its reading. To prevent passing current through the indicator 36 in a case of short across the electrodes 31–32 and respective collapse of the pulses across the comparator's 34 output, the diode 37 is connected in series with the indicator 36.

The meter shown in FIG. 7 serves the second (open-circuit version) and works as follows. The timer 40 triggers ramp-voltage generator 41 which controls reactance element 42. The essence of element 42 is that it changes either frequency of oscillator or any component of reactance of resonant circuit this oscillator is associated with. It can be a varicap, an inductor and so on. Both oscillator and resonant circuit are included in measuring unit 43. Under control of ramp voltage of the unit 41, reactance element 42 gradually modulates reactance of measuring unit 43 and passes it through a condition of the resonance every cycle. Amplitude detector 44 extracts an envelope of voltage of unit 43 and directs it to the unit 45 which forms a single pulse every time the detector's 44 output voltage passes its maximum. This pulse resets trigger 46 which was set up before by timer 40. As a result, rectangular pulses appear trigger's 46 output. The duration of said pulses is a function of reactance of reactance-element 42 and depends on deviation either resonance frequency or resonant LC-characteristics of unit's 43 circuit. From trigger's 46 output these pulses enter input of the DC-filter 47. DC-filter 47 extracts DC-voltage that is proportional to duration of said pulses and direct said voltage to one of the inputs of differential amplifier 48. Another input of said amplifier is associated with reference voltage source 49 which produces the voltage equal to that for unit's 47 output which unit 47 produced when no tested capacitor is connected. Differential amplifier 48 produces the difference of two DC-voltages applied to its input. Due to that, the amplifier's 48 output voltage is equal to zero under initial status of the measuring unit 43. From differential amplifier's output 48 the voltage enters the square-unit's 50 input. This unit takes the square of the value that enters its input. From unit's 50 output the voltage enters one of the input of the arithmetic unit 51. Output of amplitude detector 44 splits for two directions. Passing the signal through first of them was just described above. Following another direction, the signal from detector's 44 output enters pick-detector 53 that extracts the peak value of the signal. This value corresponds to quality Q of the resonant circuit of measuring unit 43. The voltage from peak-detector's 53 output enters one of the input of differential amplifier 54. Another input is associated with reference voltage source 55 which produces DC-voltage equal to that for residual quality of circuit 43. That means that output voltage of differential amplifier 54 is equal to zero under initial conditions when only residual characteristics of circuit 43 present. From differential amplifier's 54 output the voltage enters another input of arithmetic unit 51. When electrode 56 touches capacitor 57 is being tested, the resonant characteristics of measuring unit 43 change because of energy loss in capacitor 57 and capacitance of total circuit the capacitor 57 is associated with, as well. Because of that condition of resonance is reached now under other value components of reactance, the reflect appearance of additional capacitance C. That means the duration of the pulses across trigger's 46 output changes too. So does DC-voltage across DC-filter's 47 output. Because reference voltage source 49 produces the voltage that is equal to that for residual meanings of capacitance of unit 43, any appearance of additional capacitance will result in origination of the DC-voltage across amplifier's 48 output. This value of this voltage is a direct function of introduced capacitance of capacitor 57 and its circuits. The units 50 takes the square of this capacitance while unit 51 performs calculation of ESR in accordance with its formula. Its output signal is displayed by unit 52.

SUMMARY, RAMIFICATIONS AND SCOPE

Thus, the reader will see that the Method and the Meters of invention provide a highly reliable yet flexible method and apparatus for in-circuit detecting defective capacitors and inductors as well, yet time-saving diagnostic procedure. Furthermore, the Method and the meters have the additional advantages in that it permits measuring with one measuring electrode connected with no necessity to connect it to capacitors' leads or terminals;

it permits measuring in a wide range of frequencies, depending on necessity and therefore increase in-circuit methods' informational value;

it allows to evaluate one of two connected in-parallel capacitors without influence from another;

it increases informational value of in-circuit method by measuring quality factor Q and tangent of dielectric loss angle tgδ of capacitor;

it provides more reliability of measuring apparatus by means of reducing number of parts.

Although the description above contains many specifities, these should not be construed as limiting the scope of invention but as merely providing illustration of some of the presently preferred embodiments of this invention. As far as the Method is concerned, any meter that measures either the energy loss or components of the impedance can be employed. The meter shown in FIG. 5 is the convenient but not the only version of that. It measures a phase shift between voltage and current through capacitor is being tested. In this meter, the main function of the indicator 36 and diode 37 is a pulse subtraction. This function can also be performed on a base of wide variety of electronic units—light-emitting diodes, operational amplifier, transformers and so on. Comparators 34–35 perform function of pulse formers and can be substituted for any electronic device that converts sinus voltage into rectangular pulses with same lasting. The meter, shown in FIG. 7, serves the open-circuit version of the Method and operates on a base of variation of reactance, measuring ESR. Instead of that, AC-bridge can be employed. It terms of functionality, the interaction of units in FIG. 7 can be reduced to following major functional units: the timer 40, the rap-voltage generators 41 and the reactance-element 42 form reactance modulating means. The trigger 46 together with the DC-filter 47 form a controllable switch. The maximum-of-signal finder is a conventional combination of units that produce output pulse every time when the signal at its input reaches the maximum. Units 48, 49, 50, 51, 54 and 55, taken in their interaction, form means to perform arithmetic operations. Both the meters in FIGS. 5 and 7 employ measuring electrodes. In a case of electrolytic capacitors with a metal envelop, the measuring electrode which to touch the envelope can be a performed as a measuring tip because the metal envelop of the capacitor has a conducting surface by itself. In case of capacitors with isulating envelopes, the electrode has a developed surface to provide a sufficient displacement current.

I claim:

1. A meter for testing capacitors in circuit, comprising:
   an alternative current source, coupled, via its first terminal, to a measuring electrode;
   a voltage comparator, operatively coupled to said electrode and another measuring electrode;
   a resistor, connected in series between said another electrode and another terminal of said alternative current source;
   another voltage comparator, whose inputs coupled to said resistor, and what's more, said another voltage comparator's input coupled in series to the input of said first voltage comparator;
   means for indicating an unipolar voltage, connected between outputs of said comparators.

2. A meter for testing a capacitor in a circuit, comprising:
   means for modulating a reactance;
   resonating means, operatively coupled to said means for modulating a reactance;
   a measuring electrode, associated with said means for modulating a reactance;
   an amplitude detector, coupled to said measuring electrode, to extract an envelope of modulated resonant signal of said resonating means;
   a maximum-of-signal finder, operatively coupled to an output of said amplitude detector to form a sole pulse when the signal at its input reaches the maximum;
   a peak-detector, coupled to output of said amplitude detector to pick-up a maximum of the output voltage of said amplitude detector;
   a controllable switch whose input is coupled to output of said means for modulating a reactance, while a control gate of said switch is coupled to the output of said maximum-of-signal finder;
   means to perform arithmetic operations accordingly to specified algorithm, with two inputs operatively coupled to outputs of said peak-detector and said switch;
   an indicator associated with an output of said means to perform arithmetic operations.

3. A method of detecting a defective capacitor in a circuit, comprising the steps of applying an AC voltage exclusively between an envelope of the capacitor and only one terminal of the capacitor, which AC voltage causes passing of an AC current through the capacitor; measuring a characteristic of the AC current caused by said voltage; and utilizing the thusly measured characteristic of the AC current for determining whether the capacitor is defective or not.

4. A method as defined in claim 3, wherein said measuring includes measuring the characteristic selected from the group consisting of a magnitude of the AC current passing through the capacitor and a phase shift between the AC voltage and the AC current passing through the capacitor.

5. A method of detecting a defective capacitor in a circuit, comprising the steps of applying an AC voltage exclusively to an envelope of the capacitor, which AC voltage causes passing of an AC current through the capacitor; measuring a characteristic of the AC current caused by said voltage; and utilizing the thusly measured characteristic of the AC current for determining whether the capacitor is defective or not.

6. A method as defined in claim 5, wherein said measuring includes measuring the characteristic selected from the group consisting of a magnitude of the AC current passing through the capacitor and a phase shift between the AC voltage and the AC current passing through the capacitor.

* * * * *